United States Patent [19]

Inoue et al.

[11] Patent Number: 5,728,473
[45] Date of Patent: Mar. 17, 1998

[54] ADHESIVE POLYIMIDE SILOXANE COMPOSITION EMPLOYABLE FOR COMBINING ELECTRONIC PARTS

[75] Inventors: Hiroshi Inoue; Seiichirou Takabayashi; Tadao Muramatu; Kenji Sonoyama, all of Yamaguchi, Japan

[73] Assignee: Ube Industries, Ltd., Yamaguchi, Japan

[21] Appl. No.: 559,607

[22] Filed: Nov. 20, 1995

[30] Foreign Application Priority Data

Nov. 18, 1994 [JP] Japan .................................. 6-285596
Aug. 25, 1995 [JP] Japan .................................. 7-217760

[51] Int. Cl.$^6$ ........................................ B32B 15/08
[52] U.S. Cl. .................... 428/448; 428/450; 428/458; 428/473.5
[58] Field of Search ........................ 428/450, 473.5, 428/447, 448, 458

[56] References Cited

U.S. PATENT DOCUMENTS 4,758,476  7/1988  Sekine et al. ...................... 428/473.5
5,180,627  1/1993  Inoue et al. ...................... 428/214

*Primary Examiner*—D. S. Nakarani
*Attorney, Agent, or Firm*—McAulay Fisher Nissen Gokdberg & Kiel, LLP

[57] ABSTRACT

An adhesive polyimide composition comprises 100 weight parts of a polyimide siloxane having a Tg of not lower than 200° C. and 0.2 to 5 weight parts of a silane coupling agent having a glycidyl group. An epoxy resin may be incorporated into the polyimide composition. The polyimide siloxane is prepared by polymerization reaction of an aromatic tetracarboxylic acid dianhydride or its derivative and a diamine composition comprising 5 to 25 mol. % of a specific diaminosiloxane and 75 to 95 mol. % of an aromatic diamine having at least two benzene rings and one oxygen atom intervening these benzene rings. The adhesive polyimide composition is generally employed in the form of a solution in an organic solvent and for combining electrically conductive or insulating members.

6 Claims, No Drawings

ADHESIVE POLYIMIDE SILOXANE COMPOSITION EMPLOYABLE FOR COMBINING ELECTRONIC PARTS

FIELD OF THE INVENTION

The present invention relates to an adhesive polyimide composition and an adhesive composite comprising a substrate and an adhesive polyimide layer. More particularly, the invention relates to an adhesive polyimide composition favorably employable for combining electronic parts such as of silicon, metal, and heat-resistant plastic material.

BACKGROUND OF THE INVENTION

Recently, the function and capacity of semiconductor chips are increased and their sizes are enlarged. Nevertheless, it is desired to keep or even reduce the sizes of electronic devices. Under the circumstances, new designs for more densely arranging semiconductor chips have been proposed. One representative design is called LOC (lead-on-chip) structure for manufacturing memory element which comprises fixing a chip on a lead frame equipped with no die pad using a double sided adhesive tape. As for logic element, there is proposed a multi-layered lead frame structure in which an electric source and ground are mounted on a separate frame and a metal plate is multi-layered for heat radiation. By utilizing these structures of new design, reduction of the element size can be accomplished because these structures enable to make wiring within chip, simplification of wire bonding, enhancement of signal transfer rate by shortened wiring, and heat radiation of high efficiency. The heat radiation of high efficiency is required to cope with increase of heat produced by increased electric power consumption.

In these new structures, a variety of elements of different materials should be bonded to each other. For instance, bonding between a semiconductor chip and a lead frame, bonding between a lead frame and a plate, bonding of two lead frames to each other, and so on are required. Naturally these bondings directly effect reliability of the obtained element. The bondings should be kept reliably not only in the procedures for manufacture of the element but also in the course of practical use of the produced element. In these procedures and courses, the element encounters various heat and humidity conditions. Further, the bonding should be performed with no high skill.

The bonding of these members and parts is performed using an adhesive in the form of paste. The adhesive is sometimes coated on a heat-resistant substrate. Heretofore, heat curable adhesives such as of epoxy type, acrylic resin type and rubber-phenol resin type have been employed for the bonding. However, these known heat curable adhesives have certain disadvantageous features such as inherently contaminated ionic impurity, low productivity due to requirement of high temperature and long period of time for curing the resin, production of large amount of volatile materials in the curing procedure which stain the lead members, and high moisture absorption. These features are unfavorable in view of the recent requirement for adhesive enabling bonding of high reliability.

A number of proposals for employing heat-resistant heat contact pressure adhesives in the form of a film in place of the heat curable adhesives. For instance, Japanese Patent Provisional Publication (unexamined publication) No. H 1-282283 discloses hot melt adhesives of polyamideimide type and polyamide type. Japanese Patent Provisional Publication (JPPP) Sho 58-157190 discloses a process for manufacturing flexible circuit-printable substrate utilizing a polyimide adhesive. Japanese Patent Provisional Publications No. Sho 62-235382, No. Sho 62-235383, and No. H 2-15663 all describe heat curable polyimide adhesive in the form of film.

Japanese Patent Provisional Publication (JPPP) No. Sho 51-63881 describes a composite of a heat-resistant film and a metal foil which is bonded by a heat resistant adhesive comprising a polyamideimide resin and an epoxy resin.

JPPP No. Sho 59-197479 describes a curable composition comprising polyamic acid and an epoxy resin precursor.

JPPP No. Sho 62-243673 describes a heat curable (or thermosetting) polyimide adhesive comprising an epoxy resin, a polyimide resin soluble in an organic solvent, a reaction solvent and a cross-linking agent.

JPPP No. Sho 64-69667 (corresponding to U.S. application Ser. No. 088,142) describes a polyimide coating composition comprising a simple polyimide, an aminosilane compound and a neutral solvent.

JPPP No. H 1-282283 describes a hot melt adhesive comprising a polyamideimide compound which employs a diamine component having three benzene rings.

JPPP No. H 2-15663 describes an adhesive tape for lead frame which comprises a polyimide film having a semi-cured polyimide type LARC adhesive on both sides thereof.

JPPP No. H 5-332443 describes an adhesive film which is prepared by drying a composition comprising a silicone-modified polyimide, a cross-linking agent (aromatic polyamine or polycarboxylic acid), and a solvent.

JPPP No. H 5-331445 describes an adhesive film which is obtained from a solution of a polyimide resin in an organic solvent having a boiling point of not higher than 180° C., in which the polyimide resin employs $\alpha,\omega$-bisaminopolydimethylsiloxane as a portion of its diamine component.

JPPP No. H 6-45736 describes a heat curable film comprising an aromatic polyimide having a specific formula.

JPPP No. H 6-172713, No. H 6-172714, and No. H 6-172736 describe an adhesive film comprising a polyimide resin soluble in an organic solvent which is prepared from a tetracarboxylic acid dianhydride, an aromatic diamine and diamino siloxane.

The polyamide and polyamideimide resins disclosed in the above publications have relatively high water absorption due to the presence of a hydrophilic amide group in their molecular structure. Therefore, these resins are not appropriate as the use of adhesives for electronic devices which require extremely high production reliability.

The polyimide adhesive which is modified to become heat curable requires a curing condition such as 30 minutes at 275° C., 50 kg/cm², or requires a pre-treatment to have a semi-cured condition and then a long curing time. The long curing time required is naturally disadvantageous for production of electronic devices in a large scale. Moreover, a condensation water is produced in the curing procedure, which is undesirable for inclusion into electronic devices which are sensitive to heat, pressure, and water.

An ordinary polyimide resin which is neither heat curable nor thermoplastic is known to have high heat resistance, non-flammability, and high electric insulation. Therefore, the polyimide resin is employed as material for inclusion into electronic devices. However, the polyimide shows a certain water absorption. Moreover, the polyimide cannot be easily processed because it has an extremely high melting temperature or cannot be melted and is not soluble in most of organic solvents. Therefore, when the polyimide resin is employed as material for producing insulative intervening layer or surface coating layer of a semiconductor device, the polyimide resin is not directly employed, but a precursor of polyimide, that is, a polyamic acid (which is soluble in amide type solvents) is coated on a member of semiconductor and heated to remove the solvent and to give an imide group. Since the amide type solvent has a high boiling point, a long period of time and a high temperature are required for complete removal of the solvent. Further, in the course of removal of the high boiling point amide solvent, bubbles may be produced in the polyimide layer to be prepared. Moreover, such long time treatment at a high temperature sometimes causes deterioration of the resulting semiconductor product.

Accordingly, almost all of the polyamide, polyamideimide and polyimide compositions described in the above-mentioned publications have certain unfavorable features, such as, high water absorption, poor adhesion, particularly, to a polyimide film, low solubility in an organic solvent of a low boiling temperature, or the like.

SUMMARY OF THE INVENTION

Accordingly, the present invention has an object to provide an adhesive polyimide composition which shows easy adhesion within a relatively short time at a temperature of 250° to 300° C., and has a high heat resistance, a low water absorption and a satisfactory solubility in organic solvents having a low boiling point such as tetrahydrofuran (THF), 1,4-dioxane and ethylene glycol dimethyl ether.

The present invention resides in an adhesive polyimide composition comprising:

100 weight parts of a polyimide siloxane having a glass transition temperature of not lower than 200° C., said polyimide siloxane being prepared from an aromatic tetracarboxylic acid dianhydride or its derivative and a diamine composition comprising 5 to 25 mol. % of a diaminosiloxane having the formula (I):

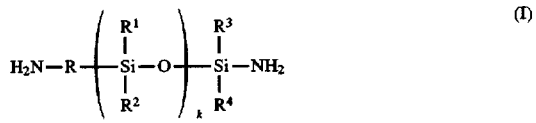

wherein R is a divalent hydrocarbon residue, each of $R^1$, $R^2$, $R^3$, and $R^4$ independently is a lower alkyl group or phenyl, and k is an integer of 0 to 30, and 75 to 95 mol. % of an aromatic diamine having the formula (II):

wherein $R^5$ represents one of the formulas of —Bz—O—Bz— and —Bz—O—X—O—Bz—, wherein Bz means a benzene ring and X represents —Bz— or —Bz—Y—Bz—, wherein Y is $SO_2$, O, $CH_2$ or $C(CH_3)_2$, and 0.2 to 5 weight parts of a silane coupling agent having a glycidyl group.

DETAILED DESCRIPTION OF THE INVENTION

The adhesive polyimide composition of the invention preferably comprises further 0.1 to 30 weight parts of an epoxy resin. The aromatic tetracarboxylic acid dianhydride or its derivative preferably is 2,3,3',4'-biphenyltetracarboxylic acid dianhydride or its derivative.

The adhesive polyimide composition of the invention preferably has a water absorption not more than 1 wt. % and is preferably used in the form of a film.

In the preparation of the adhesive polyimide composition film of the invention, the polyimide is employed in the form of a solution which comprises 100 weight parts of the polyimide siloxane and the silane coupling agent in an organic solvent.

The adhesive polyimide composition of the invention can be employed for the formation of an adhesive composite comprising a substrate such as of silicon, metal and heat-resistant plastic material, and an adhesive layer of the polyimide composition of the invention. The adhesive composite can be prepared by a process comprising the steps of coating a solution of the polyimide composition in an organic solvent on the substrate to give a coated layer, and drying the coated layer to remove the solvent.

The above adhesive composite can be utilized to give a composite comprising two substrates and an adhesive polyimide composition layer intervening between these substrates, in which one substrate is an aromatic polyimide film and another substrate is material selected from the group consisting of an aromatic polyimide film, a silicon plate, a copper film, or a polyimide siloxane film and the adhesive polyimide composition layer is made of the adhesive polyimide composition of the invention and has a water absorption of not more than 1 wt. %.

The adhesive polyimide composition is industrially advantageous because it can be employed for combining a film of an aromatic polyimide prepared from 3,3',4,4'-biphenyltetracarboxylic acid anhydride and p-phenylene diamine with the same polyimide film or other substrate materials such as metal plate, silicon wafer and films of other heat-resistant plastic film. These materials can be easily combined by the adhesive polyimide composition of the invention without surface activating treatment.

The aromatic tetracarboxylic acid dianhydride or its derivatives is preferred to be 2,3,3',4'-biphenyltetracarboxylic acid dianhydride or its derivatives such as its free acid and esters. The dianhydride is most preferred. Other examples of the aromatic tetracarboxylic acids for the dianhydride and its derivatives include 3,3',4,4'-biphenyl tetracarboxylic acid, 3,3',4,4'-benzophenonetetracarboxylic acid, 3,3',4,4'-diphenylethertetracarboxylic acid, bis(3,4-dicarboxyphenyl) methane, 2,2-bis(3,4-dicarboxyphenyl)propane, and pyromellitic acid. The aromatic tetracarboxylic acid dianhydride or its derivatives preferably contains not less than 75 mol. % of 2,3,3', 4'-biphenyltetracarboxylic acid dianhydride.

In the diaminosiloxane of the formula (I), R preferably has 2 to 6 carbon atoms, and preferably is 3 to 5 methylene group or a phenylene group. Each of $R^1$, $R^2$, $R^3$ and $R^4$ preferably is a lower alkyl group having 1 to 5 carbon atoms (e.g., methyl, ethyl, or propyl) or a phenyl group. "k" preferably is an integer of 1 to 20, more preferably is an integer of 3 to 15. These groups and numbers are appropriate in view of its reactivity and the characteristics such as heat resistance of the resulting polyimide siloxane. The diaminosiloxane is used in an amount corresponding to 5 to 25 mol. % of the diamine component to be employed for the preparation of the polyimide siloxane. The amount is appropriate in view of the solubility and heat resistance of the resulting polyimide siloxane.

Examples of the diaminosiloxane of the formula (I) include ω,ω'-bis(2-aminoethyl)polydimethylsiloxane, ω,ω'- bis(3-aminopropyl) polydimethylsiloxane, ω,ω'-bis(3-aminobutyl)polydimethylsiloxane, ω,ω'-bis(4-aminophenyl)polydimethylsiloxane, ω,ω'-bis(4-amino-3-methylphenyl)polydimethylsiloxane, ω,ω'-bis(3-aminopropyl)polydimethylsiloxane, and bis(aminopropyldimethylsilyl)benzene.

At least 75 mol. % of the diamine component to be employed for the preparation of the polyimide siloxane should be the aromatic diamine of the formula (II). If the aromatic diamine has only one aromatic ring, the resulting polyimide siloxane would have poor solubility in a low boiling point solvent such as tetrahydrofuran. Diamine components other than aromatic diamine are not appropriate from the viewpoint of heat resistance.

Examples of the aromatic diamine of the formula (II) include 1,4-bis(3-aminophenoxy)benzene (1,4,3-APB), 1,3-bis(3-aminophenoxy)benzene (1,3,3-APB), 1,3-bis(4-aminophenoxy)benzene (1,3,4-APB), 2,2-bis[4-(4-aminophenoxy)phenyl]propane (BAPP), 4,4'-diaminodiphenylether (4,4'-DDE), 3,3'-diaminodiphenylether, 3,4'-diaminodiphenylether, 4,4'-diaminodiphenylsulfone, 3,3'-diaminodiphenylsulfone, 2,2-bis(4-aminophenyl)hexafluoropropane, 2,2-bis[4-(4-aminophenoxy)phenyl]hexafluoropropane, bis-4-(4-aminophenoxy)phenylsulfone, bis-4-(3-aminophenoxy)phenylsulfone, and 4,4'-diaminodiphenylmethane.

The aromatic tetracarboxylic acid dianhydride or its derivative and the diamine component are preferably used in a ratio of equivalent (i.e., [equivalent of total carboxylic acid component/equivalent of total diamine=r) under the condition of $0.900 \leq r \leq 1.08$. If "r" is too low or high, the resulting polymer likely has a relatively low molecular weight and shows a relatively low heat resistance. Further, if "r" is too high, unreacted carboxylic acid is apt to decompose under heating to produce a gas in the coated layer. r=1 is most preferred.

The reaction between the aromatic tetracarboxylic acid dianhydride or its derivative and the diamine can be performed in an aprotic (i.e., non-protonic) polar solvent according to the known methods. The aprotic polar solvent may be N,N-dimethylformamide (DMF), N,N-dimethylacetamide (DMAc), N-methyl-2-pyrrolidone (NMP), tetrahydrofuran (THF), diethylene glycol dimethyl ether (diglyme), cyclohexanone, or 1,4-dioxane. The aprotic solvent can be employed singly or in combination with each other. The aprotic solvent also can be employed in combination with a compatible non-polar solvent such as an aromatic hydrocarbon (e.g., toluene, xylene or solvent naphtha). The non-polar solvent in the reaction solvent should be less than 30 wt. % of the total solvent. If the reaction solvent contains too much non-polar solvent, a polyamic acid produced by the reaction likely precipitates from the reaction solution.

The reaction between the aromatic tetracarboxylic acid dianhydride or its derivative with the diamine component is preferably carried out by placing a sufficiently dried diamine component in the reaction solvent to give a solution and then placing a sufficiently dried aromatic tetracarboxylic acid component (dianhydride or its derivatives) of a ring closure ratio of not less than 98%, preferably not less than 99%. The resulting polyamic acid solution is heated in the reaction solution to perform dehydration and ring closing reaction for imidization, yielding a polyimide siloxane. Water produced in the course of the imidization reaction disturbs the ring closing reaction. Therefore, the water is removed in the presence of a water-incompatible organic solvent by azeotropic distillation through a Dean-Stark tube or the like. The aforementioned aromatic hydrocarbons can be employed as the water-incompatible organic solvent. In the imidization reaction, a catalyst such as acetic anhydride, β-picoline, or pyridine may be employed.

The resulting polyimide siloxane preferably has a molecular weight (Mn) in the range of 5,000 to 50,000, and a logarithmic viscosity of 0.2 to 1.5. The polyimide siloxane preferably has a ring closure ratio as high as possible, preferably not less than 95%, more preferably not less than 98%. If the ring closure ratio is too low, water is produced in the course of bonding procedure by imidization. The reaction mixture containing the resulting polyimide siloxane can be as such (or after adjusting the concentration of the polyimide siloxane) employed as a liquid adhesive composition. It is preferred, however, that the polyimide siloxane is precipitated and recovered from the reaction mixture by pouring the reaction mixture into a poor solvent. By this procedure, unreacted monomer and other impurities are removed, and the polyimide siloxane is purified.

The silane coupling agent having a glycidyl group preferably is heat resistant and has a boiling point of not lower than 250° C. Preferred examples of the silane coupling agent include γ-glycidoxypropyltrimethoxysilane, and γ-glycidoxypropylmethyldiethoxysilane. The silane coupling agent preferably has no amino group in the molecular structure. The silane coupling agent is employed in an amount of 0.2 to 5 weight parts, per 100 weight parts of the polyimide siloxane, from the viewpoint of adhesion at an elevated temperature. If the amount of the silane coupling agent is less than the above range, satisfactory adhesion is not accomplished. Use of the silane coupling agent in an amount of more than the upper limit is not economical, because the adhesion strength no more increases. Moreover, too much silane coupling agent makes the adhesive layer too plastic and imparts adverse effect to the adhesive later when it is heated at an elevated temperature.

The epoxy resin preferably has two epoxy group in one molecular unit and preferably is a bisphenol-A epoxy resin or a bisphenol-F epoxy resin. The epoxy resin preferably has a melting point of not higher than 90° C., such as a melting point of 0° to 80° C. Particularly preferred epoxy resin is liquid at room temperature (23° C.). The epoxy resin is generally used not more than 30 weight parts, preferably 0.1 to 30 weight parts, more preferably 0.2 to 15 weight parts, per 100 weight parts of the polyimide siloxane, from the viewpoint of workability, particularly imparting to the adhesive composition sufficient flowability at an elevated temperature.

The adhesive polyimide composition of the invention can be made in the form of a film or tape for binding or combining electronic parts by dissolving the polyimide composition in an appropriate organic solvent such as tetrahydrofuran to give an adhesive polyimide composition solution, coating the solution on a substrate and then drying the coated solution.

Therefore, the adhesive polyimide composition is preferably employed in the form of a solution in an organic solvent. In the solution, the content (or concentration) of the adhesive polyimide composition preferably is in the range of 10 to 45 wt. %, more preferably in the range of 15 to 40 wt. %. Most preferred content is between 20 and 30 wt. %. An adhesive polyimide composition solution having a concentration of lower than 10 wt. % is disadvantageous for preparing an adhesive film of a satisfactory thickness. An adhesive polyimide composition solution having a too much concentration is also disadvantageous because its production requires a long time and its viscosity is too high to give a uniform adhesive layer with no air bubbles.

The organic solvent for the preparation of the adhesive polyimide composition solution preferably has a boiling point of not higher than 160° C., from the viewpoint of workability and cost. Preferred are tetrahydrofuran (b.p.: 66° C.), 1,4-dioxane (b.p.: 101° C.), and ethylene glycol dimethyl ether (monoglyme, b.p.: 84° C.).

The adhesive polyimide composition solution can be coated and dried on a substrate using a known coating apparatus such as a combination of a flow coater or a roll coater and a hot-air dryer. In more detail, the substrate coated with the solution is introduced into a hot-air dryer to dry the coated solution at a temperature for evaporating the solvent, preferably at a temperature of 60° to 200° C. The dried solution layer can be peeled off the substrate. The substrate can be a metal foil or plate of stainless, aluminum or copper, a silicon plate such as silicon wafer, a heat resistant plastic film such as an aromatic polyimide film and a polyester film, particularly, a film of an aromatic polyimide which is prepared from an aromatic tetracarboxylic acid component comprising 3,3',4,4'-biphenyltetracarboxylic acid dianhydride and an aromatic diamine component. Until now, there is not known a heat resistant adhesive composition for binding the aromatic polyimide film of this type with other material at a satisfactorily high strength.

The substrate having the coated and dried adhesive polyimide composition solution can be employed as such for receiving another substrate on the adhesive polyimide composition layer. The adhesive polyimide composition of the invention is also employable for preparing a multi-layered composite comprising three or more substrate or related materials.

The adhesive polyimide composition film can be cut to a chip or strip of an appropriate size, placed on an appropriate substrate such as a ceramic member, silicon wafer, copper foil, aluminum foil, gold foil, a heat resistant polyimide film such as that mentioned above, and heated thereon using a hot heat block. The adhesive polyimide composition solution can be coated and dried on a member of electronic parts, and other member is placed on the dry layer. These composite is then heated for fixing the other member on the former member.

The present invention is further described by the following non-limitative examples. In the examples, "part(s)" means "part(s) by weight", unless otherwise indicated.

The molecular weight of the polymer was determined using a commercially available MLC-8020 (by Toso Co., Ltd.) and preparing a calibration curve in advance by use of a monodispersed polystyrene. Accordingly, the molecular weight is indicated in terms of a polystyrene-converted molecular weight. Other measurements were carried out in the following manner.

(1) Characteristics of polyimide siloxane and adhesive composition sheet

TGA: TGA-50 (commercially available from Shimazu Seisakusho Co., Ltd.)
Measurement conditions:
  Temperature elevation: 5° C./min.
  Temperature range: Room temperature to 600° C.
  Circumferential conditions: in air, 30 mL/min.
Adhesion strength:
  A pair of specimen of Fe-Ni alloy (42 alloy) of -continued 25 μm thick which was previously washed with acetone were employed. The adhesion strength (at 180° peeling) was measured in a tensile strength tester (Type 200 available from Intesco Corp.) at a peeling rate of 50 mm/min. at 25° C.
Dynamic viscoelasticity:
  Viscoelasticity analyzer RSA II (available from Leometrix Corp.)
    Sample: Film of 5 mm (width) × 22 mm (length)
    Measurement conditions:
      Tests: Tension - Compression
      Mode: Dynamic
      Steep type: Temperature step 3° C.
                  Retention 30 sec.
      Strain (%): 0.05%
      Frequency: 1.0 Hz
      Temperature range: −150° C. to upper measurement limit
Logarithmic viscosity ($\eta_{inh}$):
  The polymer was dissolved in N-methyl-2-pyrrolidone to give a polymer solution of 0.5 g/100 mL and its viscosity was measured at 30° C. Simultaneously, a viscosity of the solvent used was measured at the same temperature. The viscosity values were treated as follows:
Logarithmic viscosity (ln) =
  (Viscosity$_{solution}$/Viscosity$_{solvent}$)/Concentration$_{solution}$
Mn: calculated from the polystyrene converted molecular weight

EXAMPLE 1

In 500 mL-volume glass flask equipped with a thermometer, an inlet-outlet and a stirrer were placed 26.48 parts (90 mmol.) of 2,3,3',4'-biphenyltetracarboxylic acid dianhydride (a-BPDA), 16.8 parts (20 mmol.) of ω,ω'-bis(3-aminopropyl)polydimethylsiloxane (BAPS) (X-22-161 AS k=8, available from Shin-Etsu Silicon Co., Ltd.), and 300 parts of N-methyl-2-pyrrolidone (NMP). The mixture was heated to 50° C. in the stream of a nitrogen gas to prepare a solution. To the solution were added 28.74 parts (70 mmol.) of 2,2-bis[4-(4-diaminophenoxy)phenyl]-propane (BAPP). The mixture was then stirred at the same temperature for one hour. To the resulting solution was further added 50 parts of xylene, and the mixture was heated to 200° C. The mixture was then refluxed under stirring for 3 hours with distilling off the produced water, to obtain a homogeneous polymer solution containing 18 wt. % of polyimide siloxane.

The polymer solution was left to reach room temperature, and filtered under pressure. The filtrate was mixed with an ion-exchanged water to precipitate the polyimide siloxane. A purified polyimide siloxane was then recovered after washing and drying at 250° C. for 5 hours. Yield: 54 parts (95%), Imidization ratio: approximately 100%, logarithmic viscosity: 0.52). By measuring GPC of the obtained polyimide siloxane, it was determined that the number average molecular weight (Mn) was 15,600, and weight average molecular weight (Mw) was 59,500. The polyimide siloxane was then subjected to thermogravimetry to give its heat decomposition starting temperature of 418° C. The measurement of dynamic viscoelasticity (in terms of tan δ) using a viscoelasticity analyzer RSA II (available from Leometrix Corp.) indicated that Tg was 234° C.

In a 500 mL-volume glass flask were placed 100 parts of the above-obtained polyimide siloxane, 5 parts of two functional epoxy compound (Ep 807, liquid, available from Yuka-Shell Epoxy Co., Ltd.), 2 parts of γ-glycidoxypropyltrimethoxysilane (available from Shin-Etsu Silicon Co., Ltd.), and 300 parts of THF (solvent). The mixture was stirred at 23° C. for approximately 5 hours to give a liquid adhesive composition for electronic parts (viscosity at 30° C.: 45 poise). The liquid adhesive composition maintained the homogeneous condition and an appropriate viscosity after storage at room temperature for one week.

The liquid adhesive composition was coated on a polyester film having a release coating (Binasheet, available from Fujimori Industries Co., Ltd.), and dried at 120° C. for 10 min. The dried adhesive composition coating was easily separated from the polyester film to give an adhesive tape of 35 μm thick for electronic parts. The obtained adhesive tape showed the same Tg as that of the polyimide siloxane employed. The adhesive tape was heated to 250° C. for 10 min., in a GC-MS (of Shimazu Seisakusho Co., Ltd.) and observed production of gaseous material. Almost no gas production was observed.

The adhesive tape was placed between a pair of the aforementioned 42 alloy foil (thickness: 25 μm) and pressed in a heat press at 300° C. and 50 kg/cm$^2$ for 30 min. The resulting composite was subjected to the 180° peeling test. A satisfactory adhesion strength such as 2.8 kg/cm was observed. No air bubbles were observed in the adhesive film.

The composite was allowed to stand in a hot dryer under the conditions set forth in Table 3. The composite was then taken out of the dryer and subjected to measurement of adhesion strength. The retention of adhesion strength was then calculated and is set forth in Table 3.

EXAMPLES 2–3 AND COMPARISON EXAMPLE 1–2

In the same manner as in Example 1, polyimide siloxanes having the composition and characteristics set forth in Table 1 were prepared and mixed with other components set forth in Table 1 to give adhesive polyimide composition films. The films were subjected to the same tests as in Example 1. The test results are set forth in Table 2.

The composites of Examples 2 and 3 were allowed to stand in a hot dryer under the conditions set forth in Table 3. Each composite was then taken out of the dryer and subjected to measurement of adhesion strength. The retention of adhesion strength was then calculated and is set forth in Table 3.

In Comparison Example 2, a polymer precipitated in the course of polymerization reaction and no homogeneous adhesive composition was obtained.

TABLE 1

| | Polyimide siloxane (Ps) | | | | Composition | |
|---|---|---|---|---|---|---|
| Example | Components (amount, mM) | ($\eta_{inh}$) | Mn | Tg | Components (parts) | Viscosity (poise) |
| Ex. 1 | a-BPDA 90 BAPS 20 BAPP 70 | 0.52 | 15,600 | 234 | Ps-1 100 Ep807 5 GPTMSi 2 THF 200 | 45 |
| Ex. 2 | a-BPDA 70 BAPS 10 BAPP 60 | 0.58 | 16,200 | 245 | Ps-2 100 Ep807 5 GPTMSi 2 THF 200 | 65 |
| Ex. 3 | a-BPDA 70 BAPS 10 BAPP 60 | 0.58 | 16,200 | 245 | Ps-2 100 GPTMSi 2 THF 200 | 65 |
| Comp. Ex. 1 | a-BPDA 90 BAPS 20 BAPP 70 | 0.52 | 15,600 | 234 | Ps-1 100 Ep807 5 THF 200 | 45 |
| Comp. Ex. 2 | a-BPDA 50 BAPS 20 BAPP 30 | Polymer precipitated in the polymerization reaction | | | | |

Remarks: Ps-1 and Ps-2 are the polyimide siloxane prepared in Examples 1 and 2, respectively. GPTMSi is γ-glycidoxypropyltrimethoxysilane.

TABLE 2

| | Adhesive film | | Adhesion | |
|---|---|---|---|---|
| Example | Tg (°C.) | thickness (μm) | Strength (kg/cm) | Gas production (200° C., 10 min.) |
| Ex. 1 | 230 | 35 | 2.8 | Not observed |
| Ex. 2 | 240 | 35 | 3.2 | Not observed |
| Ex. 3 | 245 | 35 | 2.2 | Not observed |
| Com. Ex. 1 | 230 | 35 | 0.2 | Not observed |

Remarks: "Not observed" means "almost no gas production was observed".

TABLE 3

| | Retention of Adhesion Strength (%) | |
|---|---|---|
| | 180° C. × 1,000 hrs. | 200° C. × 1,000 hrs. |
| Ex. 1 | 100 | 98 |
| Ex. 2 | 100 | 94 |
| Ex. 3 | 100 | 97 |

COMPARISON EXAMPLE 3

The procedure of Example 3 was repeated except for replacing the silane coupling agent with N-phenyl-γ-aminopropyltrimethoxysilane of the same amount to prepare an adhesive polyimide composition.

The polyimide composition was processed in the same manner as in Example 1 to give an adhesive tape and the adhesive tape was employed for preparing a three layer composite of a pair of the alloy foils and the polyimide layer. The adhesion strength determined was poor such as 0.2 kg/cm.

COMPARISON EXAMPLE 4

The procedure of Example 3 was repeated except for replacing the silane coupling agent with vinyltriethoxysilane of the same amount to prepare an adhesive polyimide composition.

The polyimide composition was processed in the same manner as in Example 1 to give an adhesive tape and the adhesive tape was employed for preparing a three layer composite of a pair of the alloy foils and the polyimide layer. The adhesion strength determined was poor such as 0.1 kg/cm.

EXAMPLE 4

The adhesive polyimide composition tape of Example 1 was placed between a pair of an aromatic polyimide film (Upilex, thickness: 50 μm, available from Ube Industries Ltd., prepared from 3,3',4,4'-biphenyltetracarboxylic acid dianhydride and p-phenylenediamine) to give a three layer composite. The adhesion strength determined was as high as 1.8 kg/cm.

EVALUATION OF WATER ABSORPTION

The adhesive polyimide composition tapes of Examples 1 to 3 were measured in accordance with ASTM D570 by immersing the tape in water at 23° C., for 24 hours. The measured water absorptions are satisfactorily low as those set forth below.

Adhesive tape of Example 1: 0.6%

Adhesive tape of Example 2: 0.7%

Adhesive tape of Example 3: 0.7%

What is claimed is:

1. A composite comprising two substrates and a polyimide composition layer intervening between these substrates, in which one substrate is an aromatic polyimide film and another substrate is material selected front the group consisting of an aromatic polyimide film, a silicon plate, a copper film and a polyimide siloxane film, and the polyimide composition layer is made of an adhesive polyimide composition having a water absorption of not more than 1 wt. % and comprising:

100 weight parts of a polyimide siloxane having a glass transition temperature of not lower than 200° C., said polyimide siloxane being prepared from an aromatic tetracarboxylic acid dianhydride or its free acid or ester derivative and a diamine composition comprising 5 to 25 mol. % of a diaminosiloxane having the formula (I):

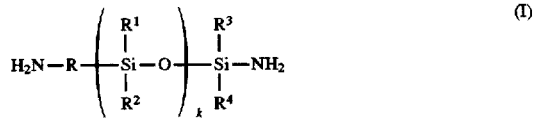

wherein R is a divalent hydrocarbon residue, each of $R^1$, $R^2$, $R^3$, $R^4$ independently is an alkyl group of 1 to 5 carbon atoms or phenyl, and k is an integer of 0 to 30, and 75 to 95 mol. % of an aromatic diamine having the formula (II)

wherein $R^5$ represents one of the formulas of Bz—O—Bz and Bz—O—X—O—Bz, wherein Bz means a benzene ring and X represents Bz or Bz—Y—Bz, wherein Y is $SO_2$, O, $CH_2$ or $C(CH_3)_2$; and 0.2 to 5 weight parts of a silane coupling agent having a glycidyl group.

2. A composite according to claim 1, in which the aromatic polyimide film is made of an aromatic polyimide prepared from 3,3',4,4'-biphenyltetracarboxylic acid anhydride and p-phenylenediamine.

3. A composite according to claim 1, in which the aromatic polyimide film has a surface having been subjected to no surface activating treatment.

4. A composite according to claim 1, in which the adhesive polyimide composition further comprises 0.1 to 30 weight parts of an epoxy resin.

5. A composite according to claim 1, wherein the aromatic tetracarboxylic acid dianhydride or its derivative is 2,3,3', 4'-biphenyltetracarboxylic acid dianhydride or its derivative.

6. A composite according to claim 1, wherein the silane coupling agent is γ-glycidoxypropyltrimethoxysilane or γ-glycidoxypropylmethyldiethoxysilane.

* * * * *